United States Patent [19]

Huerre

[11] Patent Number: 4,958,261

[45] Date of Patent: Sep. 18, 1990

[54] DEVICE FOR THE MECHANICAL SHIELDING OF PRINTED CIRCUIT BOARDS, IN PARTICULAR COLOR TELEVISION SET PRINTED CIRCUIT BOARDS

[75] Inventor: Dominique Huerre, Angers, France

[73] Assignee: Societe Electronique De La Region Pays De Loire, Paris, France

[21] Appl. No.: 348,512

[22] Filed: May 8, 1989

[30] Foreign Application Priority Data

May 10, 1988 [FR] France ................... 88 06279

[51] Int. Cl.⁵ .............................................. H05K 7/02
[52] U.S. Cl. .................... 361/417; 361/399; 361/419; 361/420
[58] Field of Search ............. 174/35 R; 361/380, 391, 361/393–395, 399, 415, 417, 419–420, 424; 211/41

[56] References Cited

U.S. PATENT DOCUMENTS

| 3,567,998 | 3/1971 | Ammerman | 361/399 |
| 3,662,224 | 5/1972 | Rauch | 361/415 |
| 3,829,741 | 8/1974 | Athey | 361/399 |
| 4,048,669 | 9/1977 | Bowler et al. | 361/391 |

FOREIGN PATENT DOCUMENTS 2849297 5/1980 Fed. Rep. of Germany .
2853367 6/1980 Fed. Rep. of Germany .

Primary Examiner—Gregory D. Thompson
Attorney, Agent, or Firm—Oblon, Spivak, McClelland, Maier & Neustadt

[57] ABSTRACT

A printed circuit board in a television set casing is repaired without the connectors of this board getting shifted with respect to the holes of the rear cover, and without this board being damaged when the television set undergoes shocks or falls. The board is placed in a U-shaped strap, the arms of which are clipped on to the cover with the strap having L-shaped lugs which are simply pushed into holes of the casing, thus forming a hinged link between the board and the casing.

6 Claims, 1 Drawing Sheet

DEVICE FOR THE MECHANICAL SHIELDING OF PRINTED CIRCUIT BOARDS, IN PARTICULAR COLOR TELEVISION SET PRINTED CIRCUIT BOARDS

BACKGROUND OF THE INVENTION

1. Field of the Invention

The present invention relates to a device for the mechanical shielding of printed circuit boards, especially for color television set printed circuit boards.

2. Description of the Prior Art

Most television electronic components, other than cathode-ray tubes, are currently placed on a single large printed circuit board. The standards applied for testing the mechanical strength of boards of this type, mounted in the casing of the television set, stipulate, in particular, the performance of drop tests where the television set is made to fall from a height of about 60 cm. To enable these boards to resist shocks of this type, they are clamped in a rigid frame, which is solidly fixed to the casing of the television set. A frame of this type masks a portion of the printed circuit, thus complicating maintenance. Furthermore, this frame does not always prevent the breakage or cracking of the printed circuit board, and the fall may cause the rear cover to be moved with respect to the casing and, hence, with respect to the printed circuit board which supports, among other elements, the connectors of the television set such as the "Peritel" connector and the aerial connector.

SUMMARY OF THE INVENTION

An object of the present invention is a device for the mechanical shielding of a board such as a printed circuit board, of a generally rectangular shape, placed in a casing with a detachable, lateral partition, one of the sides of the board being close to and parallel to this detachable partition, the shielding device being simple to make and easy to position while, at the same time, ensuring that the board is highly resistant to shocks, such as very sharp deceleration, or to vibrations, and preventing any relative movement of the board with respect to said detachable partition. Furthermore, this device should mask the components and printed circuits of the board as little as possible.

The mechanical shielding device according to the invention has a U-shaped strap clamping the board on the three sides that are not close to the detachable partition, the strap having, on its front side, at least two L-shaped lugs which freely enter corresponding holes made in the bottom of the casing, each end of the strap working together with a guiding and holding device with limited pivoting, formed on the detachable partition, advantageously a clip-on fastening device. According to an advantageous aspect of the invention, a stiffener is placed on the fourth side of the board. This stiffener is, preferably, fixed by being clipped on to the strap.

According to another advantageous aspect of the invention, especially applicable to printed circuit boards of television sets or display panels, a circular, cylindrical boss is formed on at least one of the three arms of the strap, the boss being capable of being introduced into a corresponding hole made in a wall of the casing to keep the printed circuit board in servicing position.

BRIEF DESCRIPTION OF THE DRAWINGS

The present invention will be better understood from the following detailed description of an embodiment, taken as a non-restrictive example and illustrated by the appended drawing, wherein.

DESCRIPTION OF A PREFERRED EMBODIMENT

The invention is described below with reference to a printed circuit board having the essential part of the electronic circuits of a television set or a display panel, but it is clear that the invention is not restricted to an application of this type, and that it can be put to use in practically any piece of equipment having a relatively thin board to which components are fixed, some of which should be accessible through the openings of a detachable partition fixed on the casing that encloses this piece of equipment, it being necessary for said piece of equipment to be capable of withstanding shocks or vibrations.

In the present case, the detachable partition is the rear cover of the television set, and the components which have to be accessible through this partition are input and output connectors of the printed circuit board. These components could also be components adjustable from outside by means of a screw-driver or an appropriate tool, such as potentiometers. The thin board supporting the components is the printed circuit board of the television set, i.e. the printed circuit including almost all electronic circuits of the television set (circuits such as the tuning circuits and station indicating circuits may be placed on an ancillary printed circuit fixed separately to the casing of the television set or to its front).

Figure 1:
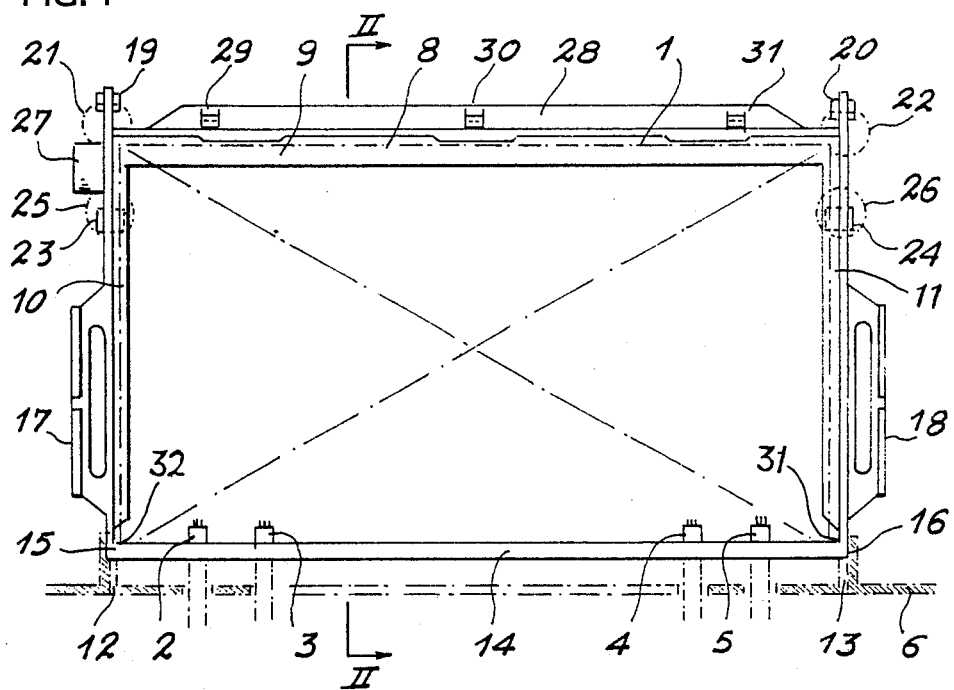
FIG. 1 shows a top view of a printed circuit board provided with a shielding device according to the invention, in normal position in a casing.
Figure 2:
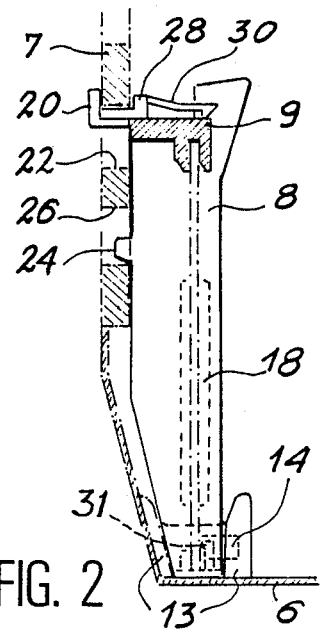
FIG. 2 shows a sectional view, along II—II of FIG. 1.

The printed circuit board 1 of the television set is a rectangular printed circuit board which has not been shown in detail in the drawing. The printed circuit board 1 has connectors used to connect the television set to the external environment: main power supply, aerial, demodulator of signals transmitted by satellite, etc. FIG. 1 gives a schematic view of four connectors of this type, referenced 2 to 5, which, in the present case, are fixed to the upper face of the printed circuit board 1, distributed along its large rear side, (namely, its large side which is closest to the detachable rear cover or partition 6).

To ensure that the printed circuit board 1 is fastened in the casing 7 of the television set as well as to make it rigid, it is provided with a U-shaped supporting device 8 which surrounds it on three sides (except for its large rear side). This supporting device 8 is made up of a central part 9 and two arms 10, 11, and it is advantageously made of plastic material in the general form of a structure with an F-shaped section. The two small arms of the F form a groove in which the edges of the printed circuit board 1 are housed in smooth friction, and the large (vertical) arm of the F is long enough for the board 1 to be at a sufficient distance from the bottom of the casing 7 when the support 8 lies on this bottom, the board 1 being positioned in the support 8. The support 8 may even be relatively flexible under deflection (forces directed parallel to the plane of the printed circuit board 1), and may therefore be relatively thin and light, thus making it inexpensive.

The ends of the arms 10 and 11 of the support 8 engage in the clip on guide devices 12, 13, which are formed in one piece with the rear cover 6 which holds them laterally (in the direction of the large sides of the printed circuit board 1) but allow them a slight clearance (of about 10 to 20°) in the direction of a vertical pivoting around the ends of these arms.

In order to hold the board 1 rigidly on its side which is not shielded by the support 8. A stiffener 14 is held on to this side. This stiffener may, for example, be a structure with an F-shaped or I-shaped section, made of plastic material, the ends 15, 16, of which are provided with suitable clip-on devices 31, 32 and get clipped on to the arms 10, 11, respectively, of the support 8. The width of the stiffener 14 and the length of the arms 10, 11 are such that, between this stiffener and the cover 6, there remains a clearance of about 5 mm. when the arms 10, 11, are clipped on to the cover 6.

To make it easier to handle the board 1, handles 17, 18, are formed on the external faces of the arms 10, 11.

On the arms 10, 11, near their junction with the part 9 of the support 8, downward projecting, L-shaped lugs 19, 20, are made. The large arms of these L-shaped lugs are perpendicular to the plane of the board 1, and their small arms are parallel to it. Furthermore, holes 21, 22, are made in the casing 7, to let these lugs go through. The diameter of these holes is greater than the length of the small arms of the L formed by the lugs 19, 20. The dimensions of the big arms of each L, formed by the lugs 19, 20, and the arrangement of these lugs with respect to the support 8, are such that when the support 8 is in position, the short arms of each L are applied against the lower face of the casing 7. To keep the support 8 more efficiently in position, studs 23, 24 respectively are formed on the arms 10, 11, behind the lugs 19 and 20. These studs 23, 24, project downwards and get housed in the holes 25, 26, made in the casing 7. Advantageously, the holes 25, 26, have the same diameter and the same distance between centers as the holes 21, 22, to unable the lugs 19, 20 to be inserted and held therein, so that the board 1 can be placed in a withdrawn position in the casing of the television set and so that better access is got to its components, for example to make an adjustment.

To position the board 1 with its support 8, it is presented in a slightly slantwise position so that the lugs 19, 20 can be easily inserted into the holes 21, 22, and so that the studs 23, 24, can made to pass. When the long arms of the lugs 19, 20, abut the front part of the holes 21, 22, the board 1 is tilted to make it parallel to the casing 7, the studs 23, 26, get housed in the holes 25, 26, abutting their rear generatrix. The rear cover 6 is then positioned and gets fixed, for example by being clipped on, to the casing, and simultaneously gets fixed to the clip-on guides 12, 13, of the support 8. Should the stiffener 14 be used, it is mounted of course before the board 1 is positioned in the casing.

Figure 3:
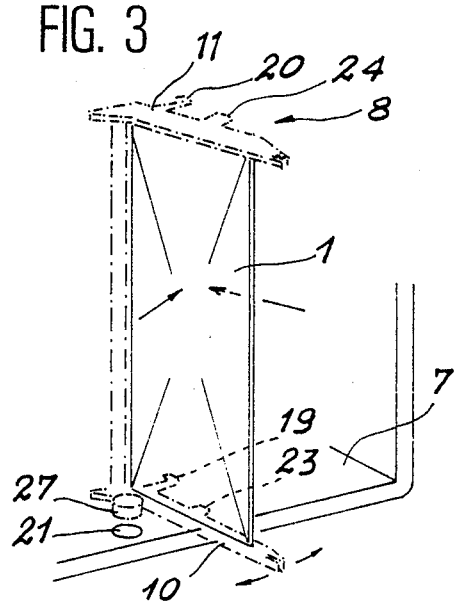
FIG. 3 shows a simplified view, in perspective, of the board of FIG. 1 in servicing position.

On one of the arms 10 or 11 of the support 8, or even on both these arms, a boss 27, shaped like a short, circular-sectioned cylinder, is formed. In the example shown, this boss is formed on the arm 10, close to its junction with the part 9. The external diameter of the boss 27 is substantially equal to the diameter of the holes 21, 22, or 25, 26. Owing to this boss 27, which can be inserted in one of these holes or, possibly, in another hole of the same diameter made at an appropriate place of the casing, the board 1 can be placed with its support 8 in servicing position as shown, for example, in FIG. 3. The circuits of the board are thus clearly visible and easily accessible, and the board can remain connected to the other elements of the television set (cathode-ray tube, control keyboard, etc.).

Advantageously, on the part 9 of the support 8, outside this support (with respect to the board 1), a runway 28 may be formed, acting as a cableway for the cables (not shown) connecting the circuits of the board 1 to other elements of the television set. To keep these cables properly positioned, clip-on clamps, such as the clamps 29 to 31 shown in the drawing, are formed.

Thus, the shielding device of the invention can be used to hold the printed circuit board 1 in position in the casing of the television set in providing for the accurate positioning of the connectors 2 to 5 with respect to the holes of the cover, the shielding device creating a link by hinging (through the L-shaped lugs 19, 20) between the printed circuit board 1 and the casing, exerting no stresses on the printed circuit board under any of its conditions of use. Furthermore, the positioning and dismantling of the printed circuit board and the casing is highly simplified.

What is claimed is:

1. A device for the mechanical shielding of a printed circuit board, in particular a color television set printed circuit board, placed in a casing with a detachable, lateral partition, one of the sides of the board being close to and parallel to said detachable partition, said shielding device comprising a U-shaped strap having a central part and two arms clamping the board on the three sides that are not closed to said detachable partition, said strap having at least two L-shaped lugs respectively associated with a respective one of said two arms which each freely enter corresponding holes made in the bottom of the casing, each end of said U-shaped strap working together with a respective guiding and holding device with limited pivoting, formed on said detachable partition.

2. A shielding device according to claim 1, wherein a stiffener is fixed on to the fourth side of the board.

3. A shielding device according to claim 2, wherein the stiffener is fixed by being clipped on to the strap.

4. A shielding device according to claim 1, wherein a circular, cylindrical boss is formed on at least one of the arms of the strap, said boss being capable of being introduced into a corresponding hole made in a wall of the casing to keep the board in servicing position.

5. A shielding device according to claim 1 wherein, on the two arms of the strap, downward projecting studs are made, said studs getting housed in holes made in the bottom wall of the casing so as to keep the board more efficiently in place in the casing.

6. A shielding device according to claim 1, wherein a cable duct and cable clip-on clamps are formed on the central part of the strap.

* * * * *